(12) United States Patent
Miller

(10) Patent No.: US 9,462,705 B2
(45) Date of Patent: Oct. 4, 2016

(54) USB DEVICE WITH PREASSEMBLED LID

(71) Applicant: SanDisk Technologies Inc., Plano, TX (US)

(72) Inventor: Robert C. Miller, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 564 days.

(21) Appl. No.: 13/648,687

(22) Filed: Oct. 10, 2012

(65) Prior Publication Data

US 2014/0098483 A1   Apr. 10, 2014

(51) Int. Cl.
| | | |
|---|---|---|
| *H05K 5/00* | (2006.01) | |
| *H05K 1/00* | (2006.01) | |
| *H01R 13/502* | (2006.01) | |
| *H01R 13/66* | (2006.01) | |
| *H01R 43/20* | (2006.01) | |

(52) U.S. Cl.
CPC .............. *H05K 5/00* (2013.01); *H01R 13/502* (2013.01); *H01R 13/6658* (2013.01); *H01R 43/205* (2013.01); *H05K 1/00* (2013.01); *Y10T 29/4913* (2015.01); *Y10T 29/49117* (2015.01)

(58) Field of Classification Search
CPC ............ H05K 1/14; H05K 1/18; H05K 7/00; H05K 7/02; H01R 13/44
USPC .............. 361/679.32, 679.54, 684, 733, 737, 361/752, 764; 439/76.1, 131
See application file for complete search history.

(56) References Cited

U.S. PATENT DOCUMENTS

| | | | |
|---|---|---|---|
| 6,999,322 B1 * | 2/2006 | Lin | 361/752 |
| 7,479,042 B2 | 1/2009 | Chen | |
| 7,485,499 B2 | 2/2009 | Brewer et al. | |
| 7,609,512 B2 * | 10/2009 | Richardson et al. | 361/679.41 |
| 7,623,354 B2 * | 11/2009 | Koh | 361/764 |
| 7,850,468 B2 * | 12/2010 | Ni et al. | 439/131 |
| 2007/0070259 A1 * | 3/2007 | Schedivy | B60R 11/02 348/837 |
| 2008/0232060 A1 * | 9/2008 | Yu et al. | 361/684 |
| 2009/0190277 A1 * | 7/2009 | Hiew et al. | 361/56 |
| 2009/0275224 A1 * | 11/2009 | Ni et al. | 439/131 |
| 2012/0009732 A1 | 1/2012 | Takiar et al. | |

OTHER PUBLICATIONS

Chinese Office Action dated Sep. 30, 2015 in Chinese Patent Application No. 201310470619.4.
Response to Office Action filed Feb. 14, 2016, and English translation of claims as amended, in Chinese Patent Application No. 201310470619.4.

\* cited by examiner

*Primary Examiner* — Courtney Smith
*Assistant Examiner* — Zhengfu Feng
(74) *Attorney, Agent, or Firm* — Vierra Magen Marcus LLP

(57) ABSTRACT

A USB memory assembly, and methods of forming same, are disclosed. The USB memory assembly includes a USB memory device within a carrier. The carrier may in turn be received within a connector shell and lid.

11 Claims, 7 Drawing Sheets

USB DEVICE WITH PREASSEMBLED LID

BACKGROUND OF THE INVENTION

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large storage capacity, have made such memory devices ideal for use in a wide variety of electronic devices, including for example digital cameras, digital music players, video game consoles, PDAs and cellular telephones.

Equally ubiquitous is the universal serial bus (USB) interface for transferring signals between devices such as those named above and other components such as for example desktop computers and the like. A typical USB storage device includes a memory portion coupled to a USB connector capable of mating within a USB slot of a host device. The memory portion typically includes a printed circuit board on which are mounted one or more flash memory chips, a controller, passive components and an LED for indicating when the memory is being accessed. While there are several types of USB connectors, the most commonly used is the type-A plug on which is a 4-pin connector, surrounded by a shield. A conventional type-A USB plug includes a base on which is formed a signal power pin, a pair of signal pins and a signal ground pin. During a conventional fabrication process, the USB connector may be affixed to the memory portion, as by welding and/or soldering, and the memory portion and connector may then be covered by the shield.

After the USB memory device is fabricated, it is typically affixed within a lid. A problem exists that currently, the USB memory device needs to be available before lidding can begin. However, lids need to be assembled, painted and printed. As one example, printing on lids is slow and can take weeks. During this time the expensive USB memory devices are sitting idle, and cannot be shipped until the entire order of USB devices and lids is completed.

DETAILED DESCRIPTION

Embodiments will now be described with reference to FIGS. 1 through 15, which relate to USB memory assembly. It is understood that the present technology may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top," "bottom," "upper," "lower," "vertical" and/or "horizontal" as may be used herein are for convenience and illustrative purposes only, and are not meant to limit the description of the invention inasmuch as the referenced item can be exchanged in position.

Figure 1:
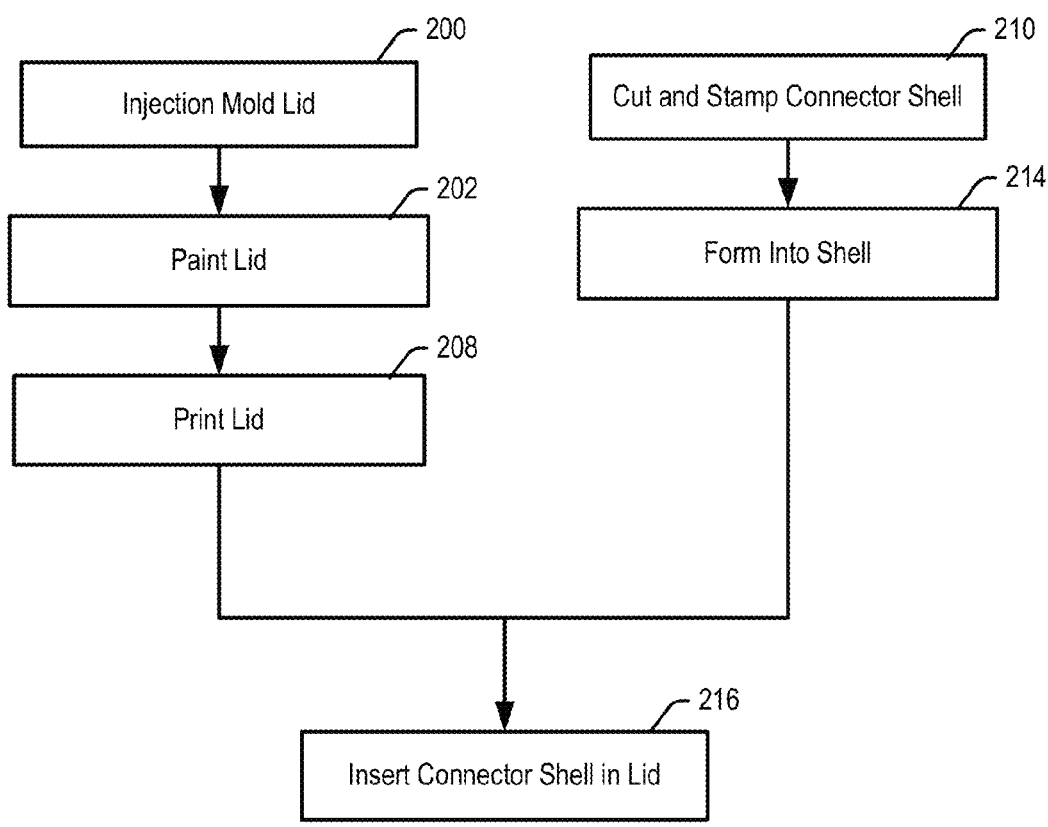
FIG. 1 is a flowchart of the fabrication process of a lid and connector shell.

An embodiment of the present technology will now be explained with reference to the flowchart of FIGS. 1 and 2 and the views of FIGS. 3 through 15. Referring initially to the flowchart of FIG. 1 and the views of FIGS. 3 and 4, a lid 100 and connector shell 102 may be fabricated and assembled together. In accordance with aspects of the present technology, this process may occur independently of the fabrication of a USB memory device, explained below. The fabrication of the lid, connector shell and USB memory device may occur at different locations and times. In one embodiment, the lid and connector shell may be fabricated before the USB memory device, and available at the fab where the USB memory device is made, so that the USB memory device may be assembled into the lid and connector shell upon completion of the USB memory device as explained below.

The lid 100 may be fabricated from a wide variety of materials and by a wide variety of methods. In the example shown, the lid 100 may be formed of plastic and injection molded in step 200. In further examples, the lid may be made of metal, rubber and other materials. In the illustrated example, the lid may be formed in two halves 100a, 100b, which may be glued, press-fit, sonically welded or otherwise affixed together, with the connector shell 102 mounted in an interior slot formed between the two halves. The lid 100 may be painted in step 202, and printed in step 208. In the flowchart of FIG. 1, the lid is painted and printed prior to mounting the connector shell within the lid, but the lid may be painted and/or printed after mounting the connector shell in further embodiments.

In the example shown, the connector shell 102 may be formed of sheet metal, such as for example Japanese Industrial Standard G3141 cold-rolled sheet steel, with a nickel plate. However, the connector shell 102 may be fabricated from a wide variety of materials and by a wide variety of methods in further embodiments. The connector shell may be cut and stamped in step 210, and formed into a shell in step 214. The shell is formed so that at least a front end portion 102*a* has a size and shape that may fit snugly within the USB port of a host device. The connector shell 102 may also be sized and shaped to define an interior within which a carrier and USB device may be mounted as explained below.

Figure 3:
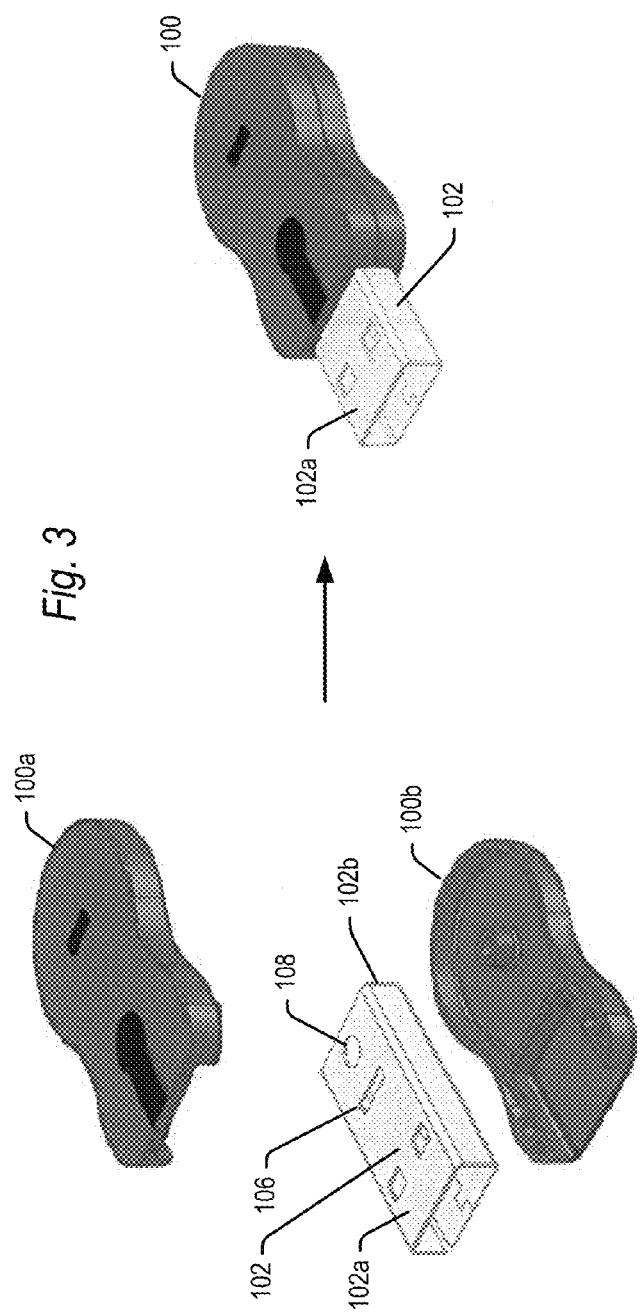
FIG. 3 is an exploded perspective view of a lid and connector shell.
Figure 4:
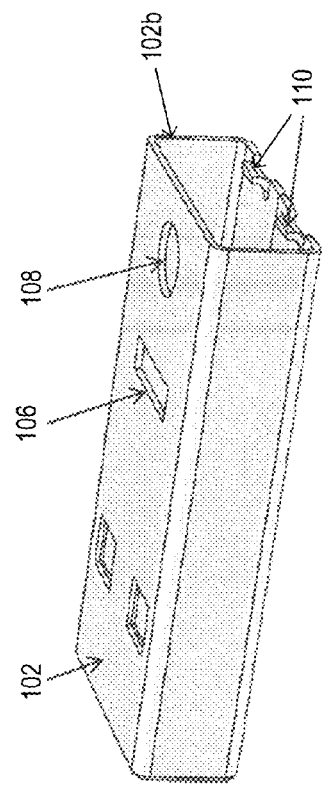
FIG. 4 is a perspective view of a connector shell.

In the stamping process, a slot 106 may be formed in the connector shell 102 for receiving a latch on the carrier to latch the carrier within the connector shell 102 as explained below. FIG. 3 further shows a circular stamped hole 108. Instead of receiving a lid 100 as shown which fixedly mounts around the connector shell, the connector shell may be pivotally mounted to a lid by a pin (not shown) through hole 108. In such embodiments, the connector shell (with the USB device mounted therein) may pivot between a first position where the USB device is enclosed within the lid, and a second position where the USB device is deployed outside of the lid.

The connector shell may have a back end 102*b* opposite the front end portion 102*a*. The back end 102*b* may include a pair of flanges 110 which act as stops for the USB memory device and carrier inserted within the connector shell 102 as explained below. While a pair of flanges 110 are shown, the connector shell may include a single flange of more than two flanges in further embodiments.

The connector shell 102 may be affixed within the lid 100 in step 216, for example by gluing, press-fit, or other method. In the example shown, the front end portion 102*a* of the connector shell 102 protrudes outside of the lid 100 after mounting. The protruding front end portion 102*a* may fit within the USB slot of a host device as explained below.

Figure 2:
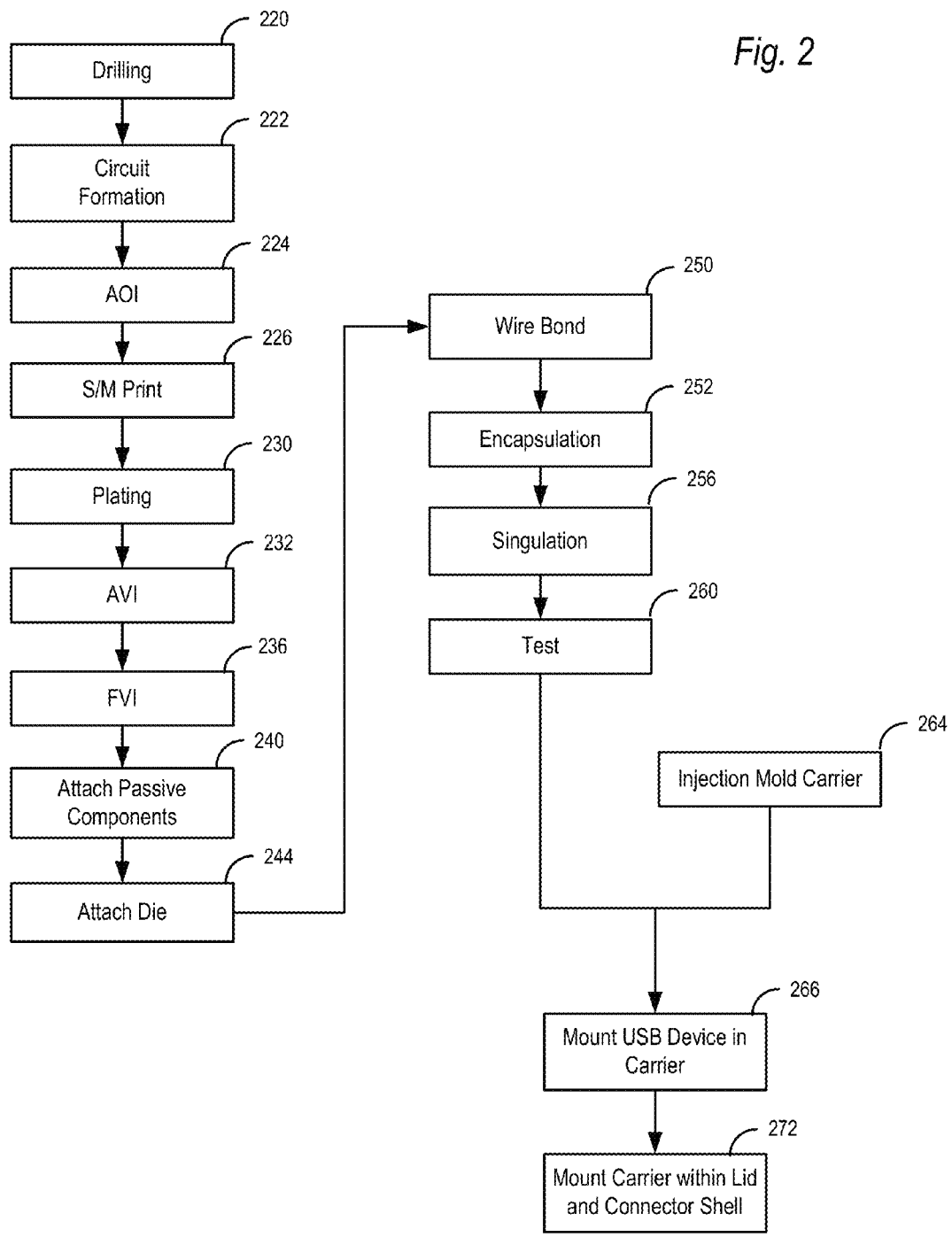
FIG. 2 is a flowchart of the fabrication process of semiconductor package according to embodiments of the present invention.
Figure 5:
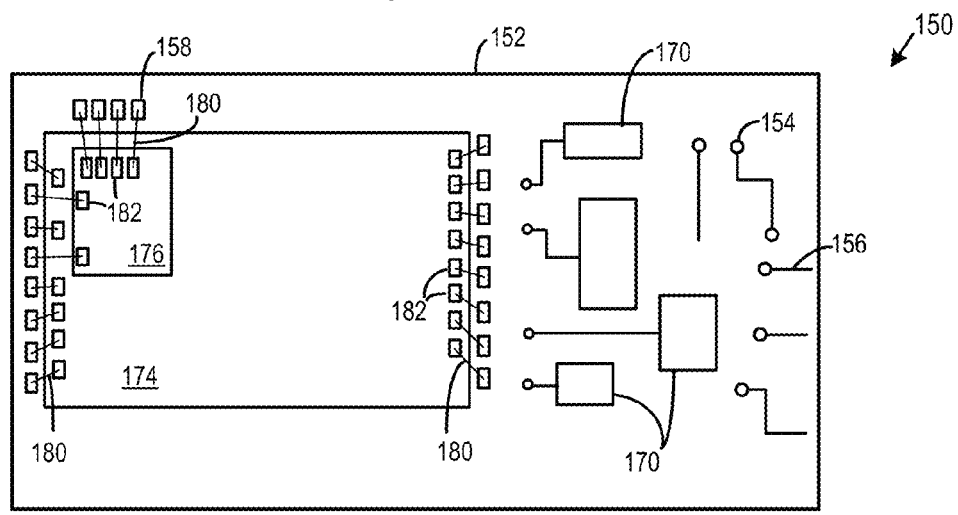
FIG. 5 is a top view of an embodiment of a USB memory device.
Figure 6:
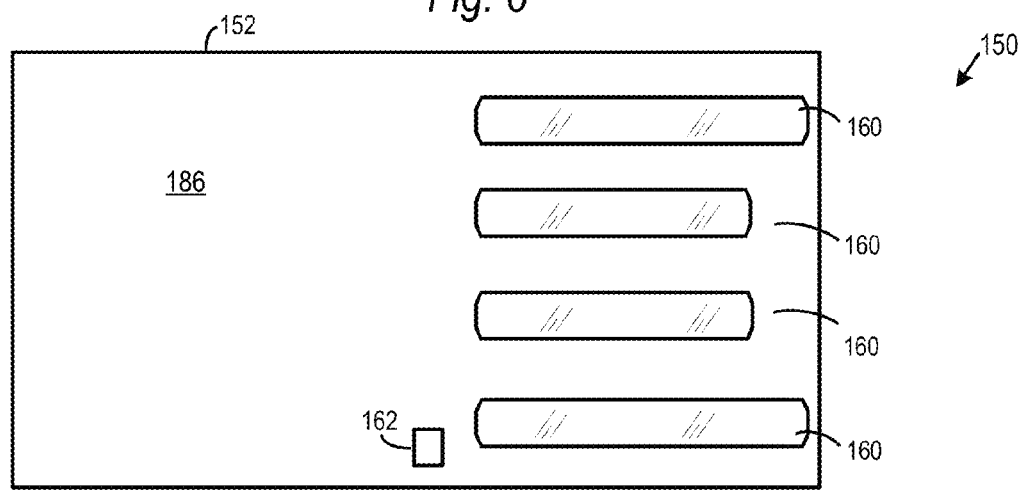
FIG. 6 is a bottom view of an embodiment of a USB memory.

FIG. 2 is a flowchart describing the fabrication of a USB memory device and its assembly into a carrier. Illustrations of the USB memory device and carrier are shown in FIGS. 5 through 12. Referring initially to FIGS. 5 and 6, the USB memory device 150 includes a substrate 152 on which are mounted semiconductor die 174, 176. Although FIGS. 5 and 6 show an individual USB memory device 150, it is understood that the device 150 may be batch processed along with a plurality of other devices 150 on a substrate panel to achieve economies of scale. The number of rows and columns of devices 150 on the substrate panel may vary.

The substrate panel begins with a plurality of substrates 152 (again, one such substrate is shown in FIGS. 5 and 6). The substrate 152 may be a variety of different chip carrier mediums, including a printed circuit board (PCB), a leadframe or a tape automated bonded (TAB) tape. Where substrate 152 is a PCB, the substrate may be formed of a core having a top conductive layer and a bottom conductive layer. The core may be formed of various dielectric materials such as for example, polyimide laminates, epoxy resins including FR4 and FR5, bismaleimide triazine (BT), and the like. Although not critical to the present invention, the core may have a thickness of between 40 microns (μm) to 200 μm, although the thickness of the core may vary outside of that range in alternative embodiments. The core may be ceramic or organic in alternative embodiments.

The conductive layers surrounding the core may be formed of copper or copper alloys, plated copper or plated copper alloys, copper plated steel, or other metals and materials known for use on substrate panels. The conductive layers may have a thickness of about 10 μm to 25 μm, although the thickness of the layers may vary outside of that range in alternative embodiments.

In a step 220, the substrate 152 is drilled to define through-hole vias 154 in the substrate 152. The vias 154 shown are by way of example, and the substrate may include many more vias 154 than is shown in the figures, and they may be in different locations than is shown in the figures. Conductance patterns are next formed on one or both of the top and bottom conductive layers in step 222. The conductance pattern(s) may include electrical traces 156 and contact pads 158. The traces 156 and contact pads 158 shown are by way of example, and the substrate 152 may include more traces and/or contact pads than is shown in the figures, and they may be in different locations than is shown in the figures. The conductance pattern on the top and/or bottom surfaces of the substrate 152 may be formed by a variety of known processes, including for example various photolithographic processes.

In embodiments, the USB connector may be formed integrally with the memory portion of the USB memory device 150. Accordingly, in embodiments, the conductance pattern may also define connector pins 160 as shown in the bottom view of FIG. 6. Alternatively, it is understood that connector pins 160 may be formed independently of substrate 152 and mounted on substrate 152 thereafter. The connector pins 160 shown are for a type-A USB connection to a host device, but it is contemplated that other types of USB connector pins may be included in the present invention. As is also shown on FIG. 6, a ground pad 162 may also be provided on substrate 152 for grounding the USB memory device 150 to the connector shell 102 as explained hereinafter.

Referring again to the flowchart of FIG. 2, the substrate 152 may next be inspected in an automatic optical inspection (AOI) in step 224. Once inspected, a solder mask may be applied to the substrate in step 226 leaving the contact pads 158 and connector pins 110 exposed. After the solder mask is applied, the contact pads 158, connector pins 160 (if formed in the conductance pattern) and any other solder areas on the conductance patterns may be plated with a Ni/Au or the like in step 230 in a known electroplating or thin film deposition process. The substrate 152 may then be inspected and tested in an automated inspection process (step 232) and in a final visual inspection (step 236) to check electrical operation, and for contamination, scratches and discoloration.

Assuming the substrate 152 passes inspection, passive components 170 may next be affixed to the top surface of the substrate 152 in a step 240 as shown in FIG. 5. The one or more passive components 170 may be mounted on the substrate 152 and electrically coupled to the conductance pattern as by connection to contact pads (not shown) in known surface mount and reflow processes. The passive components 170 may include for example one or more capacitors, resistors and/or inductors, though other components are contemplated. An LED may also be mounted to the substrate and permanently affixed during a reflow process. The LED may activate when the below-described flash memory is accessed during use of the USB flash memory device.

Referring to the top view of FIG. 5, one or more semiconductor die may next be affixed to the top surface of the substrate 152 in a step 244. The embodiment of FIG. 5 includes a flash memory die 174 and a controller die 176. The example of FIG. 5A includes two flash memory die 174 and a controller die 176. The memory die 174 may be for example flash memory chips (NOR/NAND), though other types of memory die are contemplated. Controller die 176 may for example be an ASIC. After the die 174, 176 have been mounted on the substrate, the die may be electrically coupled to the substrate via wire bonds 180 in step 250. The wire bonds 180 may be connected between die bond pads 182 on the die 174, 176 and the contact pads 158 on the substrate 152.

The controller die 176 is shown stacked atop the memory die 174, but it is understood that both of the die 174 and 176 may be mounted directly to the substrate 152 in alternative embodiments. Instead of wire bonding the die 174, 176, the die may instead be TSOP packages or flip-chip semiconductor die surface mounted to the substrate 152. Moreover, while the die 174, 176 are shown mounted on the same side of the substrate and connector pins 160, it is understood that one or both of the die 174 and 176 may be mounted on an opposite surface of the substrate 152 than the pins 160 in alternative embodiments. Where mounted on the opposite surface, contact pads 158 would also be provided on the opposite surface to allow electrical coupling of the die 174, 176 to the substrate 152.

In embodiments, after the die 174, 176 are coupled to substrate 152, the substrate and die may be encapsulated in a molding compound 136 (FIG. 5A) in step 252 to form a USB flash memory device 150. Although not critical to the present invention, the molding compound 136 may be an epoxy resin such as for example available from Sumito Corp. or Nitto Denko Corp., both having headquarters in Japan. Other molding compounds from other manufacturers are contemplated. The molding compound may be applied according to various processes, including by transfer molding or injection molding techniques. The molding compound covers at least the passive components 170, the memory die 174 and the controller die 176. The connector pins 160 may be left uncovered and exposed so that they may be mated with terminals in a host device. Ground pad 162 may also be left uncovered and exposed. In embodiments, the USB flash memory device 150 may have a thickness of less than 1 mm.

Figure 5A:
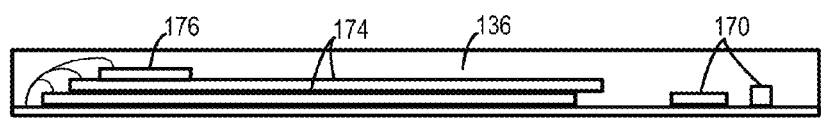
FIG. 5A is a side view of an embodiment of a USB memory device.
Figure 10:
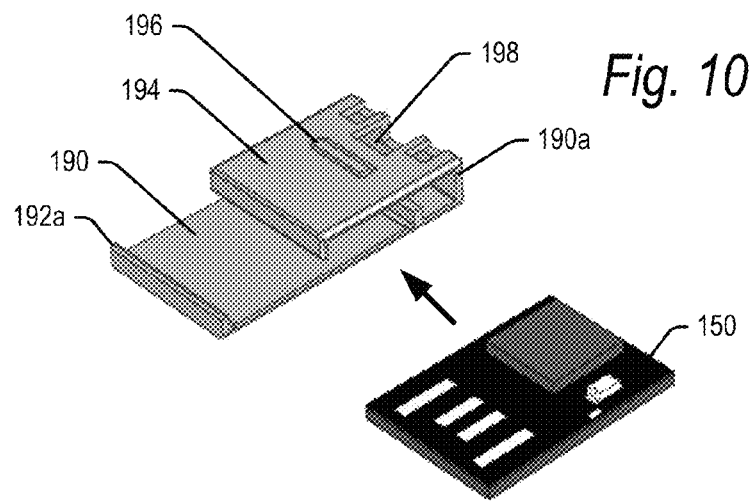
FIG. 10 is an exploded perspective view of a USB memory device and carrier.

After the USB flash memory devices 150 on the panel have been encapsulated in step 252, the respective devices may be singulated in step 256 from the panel to form the finished USB flash memory device 150 shown in FIGS. 5A and 10. Each device 150 may be singulated by any of a variety of cutting methods including sawing, water jet cutting, laser cutting, water guided laser cutting, dry media cutting, and diamond coating wire cutting. While straight line cuts will define generally rectangular or square shaped device 150, it is understood that device 150 may have shapes other than rectangular and square in further embodiments of the present invention.

Once cut into devices 150, the devices may be tested in a step 260 to determine whether the packages are functioning properly. As is known in the art, such testing may include electrical testing, burn in and other tests.

Independently of the fabrication of the USB memory device 150, a carrier 190 (FIGS. 7-9) may be fabricated in step 264. In embodiments, the carrier 190 may be injection molded from a polymer, such as for example polycarbonate, or a polycarbonate-acrylonitrile butadiene styrene polymer (PC-ABS) blend. The carrier may be formed by other methods and of other materials in further embodiments. In one such further embodiment, the carrier 190 may be formed from a metal having an electrically insulating coating.

Figure 7:
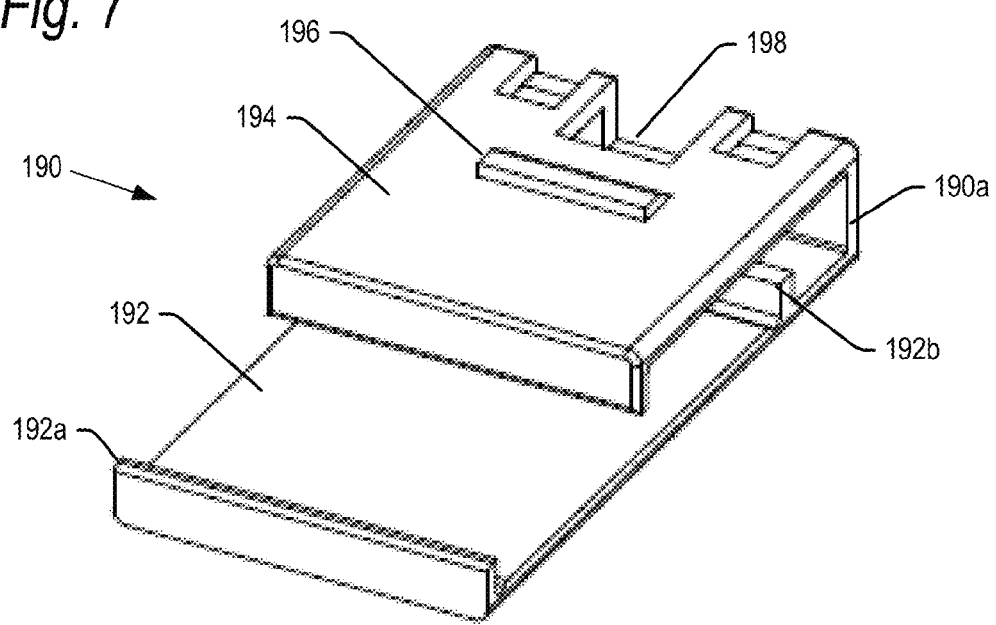
FIG. 7 is a perspective view of a carrier according to an embodiment of the present technology.
Figure 8:
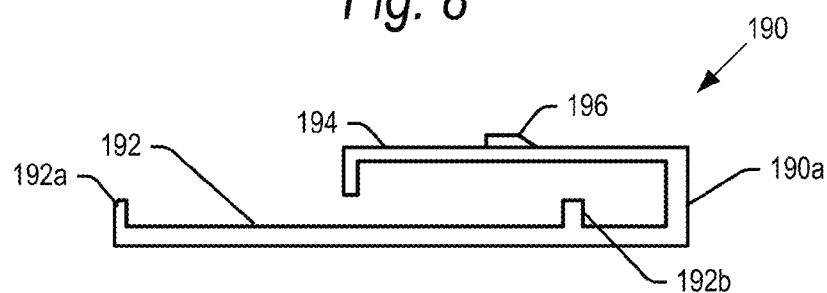
FIG. 8 is an edge view a carrier according to an embodiment of the present technology.
Figure 9:
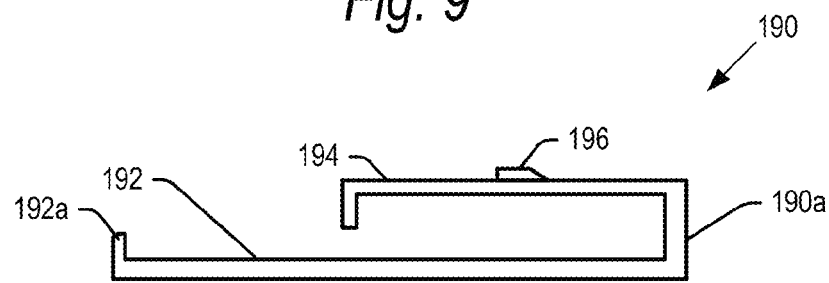
FIG. 9 is an edge view a carrier according to an alternative embodiment of the present technology.

As seen in FIGS. 7-9, the carrier 190 includes a base portion 192, including a front lip 192a and a rear lip 192b. In the embodiment of FIG. 9, the rear lip 192b may be omitted it accommodate larger USB memory devices as explained below. Carrier 190 may further include an overhanging clip 194 including a latch 196.

Figure 11:
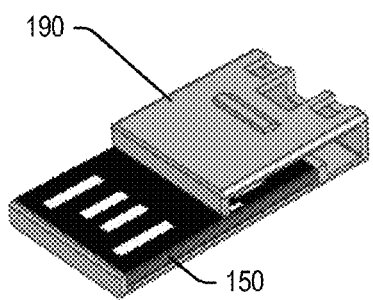
FIG. 11 is a perspective view of an assembled USB memory device and carrier.
Figure 12:
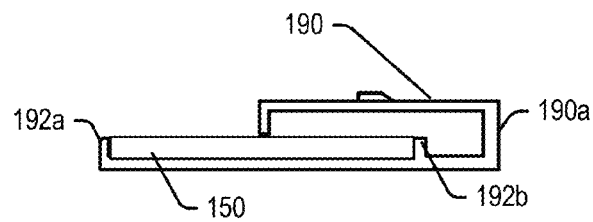
FIG. 12 is an edge view of an assembled USB memory device and carrier.

Referring to FIGS. 10-12, the completed USB memory device 150 may be mounted within the carrier in step 266. As indicated in FIG. 10, the memory device 150 may slide in laterally from the side, with connector pins 160 facing upward as shown in FIG. 11. The front and rear lips 192a, 192b are spaced from each other a distance to snugly receive the memory device 150 therebetween (though the front and rear lips 192a, 192b may be spaced a distance larger than the device 150 in further embodiments). In one example, the lips 192a, 192b may be spaced apart 16 mm to accept a 16 mm memory device 150. In another example, the rear lip 192b may be omitted (FIG. 9) so that a 22 mm memory device fits snuggle between front lip 192a a back wall 190a of the carrier 190.

The clip 194 may press or rest against a top surface of the memory device to hold the USB memory device 150 within the carrier 190. The clip 194 is cantilevered off the back wall of the carrier 190. The clip 194 extends toward the front of the carrier 190 an amount so that it does not cover a front portion of the memory device 150 when the memory device 150 is seated within the carrier 190 as shown in FIG. 11.

Figure 13:
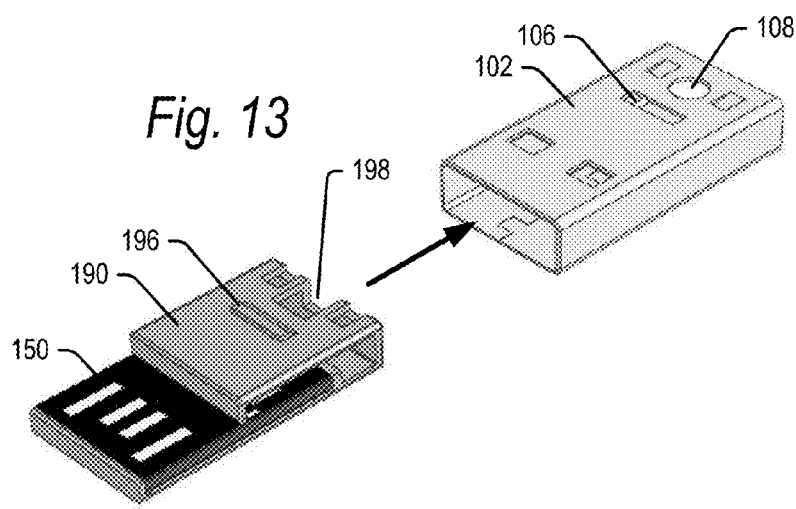
FIG. 13 is an exploded perspective view of a carrier with a USB memory device and connector shell.
Figure 14:
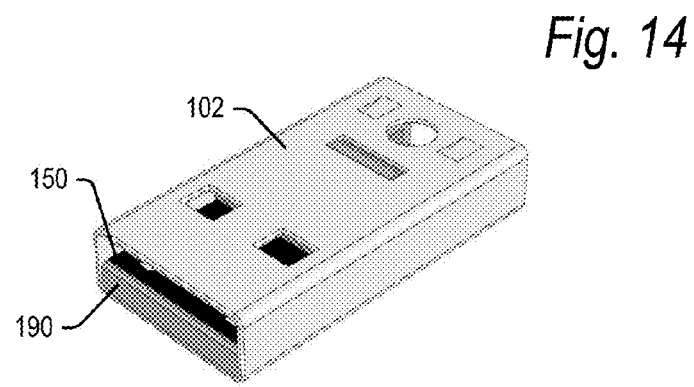
FIG. 14 is a perspective view of a carrier with a USB memory device assembled within a connector shell.
Figure 15:
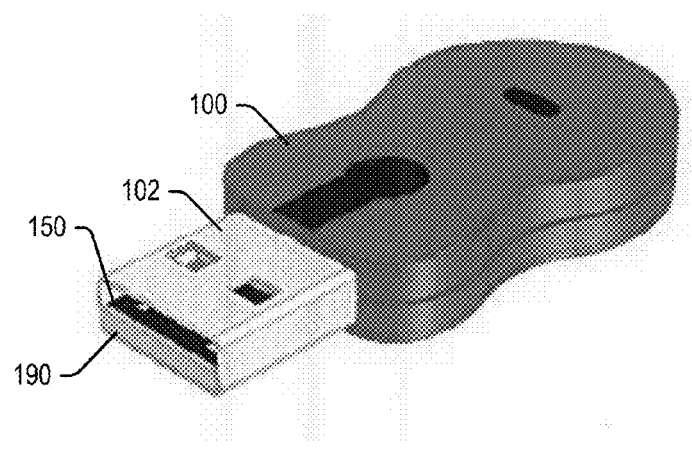
FIG. 15 is a perspective view of a carrier with a USB memory device assembled within a connector shell and lid.

Referring now to FIGS. 13-15, once the USB memory device 150 is seated within carrier 190, the device 150 and carrier 190 may be inserted into the connector shell 102 (shown without the lid in FIGS. 13 and 14) in step 272. In particular, the device 150 and carrier 190 may be inserted into front end 102a of the connector shell 102 as indicated in FIG. 13. When fully inserted (FIGS. 14 and 15), the back wall 190a of carrier 190 rests against flanges 110 of connector shell 102. In this position, the latch 196 locks within slot 106 to secure the carrier 190 and memory device 150 within the connector shell 102.

The carrier 190 may further include a slot 198 formed in the back wall 190a and clip 194 adjacent the back wall. The slot 198 aligns with the hole 108 formed in the connector shell so that the carrier 190 does not to interfere with a pin (not shown) positioned in hole 108 allowing pivoting of the connector shell 102 relative to the lid 100.

In embodiments, a ground path for dissipation of static electricity is not needed, and the USB memory device is not electrically connected to the connector shell 102. However, in alternative embodiments, the USB memory device 150 may be electrically connected to the connector shell to allow grounding of the device 150 through the connector shell when the USB memory assembly 150 is inserted within a USB port of a host device. As one example, the connector shell 102 or lid 100 may include a leaf spring or finger (not shown) formed of metal which contacts ground pad 162 (FIG. 6) defined on substrate 152 when the USB device 150 is inserted into the connector shell 102. The pad 162 and finger provide a ground path for static dissipation to the USB port of the host device.

In embodiments, the connector shell 102 (without lid) may be stocked and available for when the USB memory device 150 is completed and mounted with the carrier 190, as shown in FIG. 14. In further embodiments, the connector shell and lid may be stocked and available for when the USB memory device 150 is completed and mounted with the carrier 190, as shown in FIG. 15. As noted above, having the connector shell, or the connector shell and lid, available and ready for assembly with the USB memory device and carrier prevents the USB memory device from sitting idle after its fabrication. While designs of the USB memory device may vary, the carrier 190 provides a standard construction to fit within the connector shell. This allows prefabrication and stocking of the connector shell, or the connector shell and lid.

In addition to speeding the fabrication of the finished USB assembly, the present technology simplifies the design and fabrication of the lids. Customized lids can be made quicker by eliminating snap-together-lids. Snaps require slides and lifters in the mold which increases mold design time, tooling time, and higher cost. Lids can be glued or sonic welded at the lid supplier and delivered as assembled units. Additionally, sonic welding of lid assembly is possible since the memory device is installed afterward and is not damaged by the sonic weld vibration.

In summary, an embodiment of the present technology relates to a USB memory assembly, comprising a USB memory device; a carrier within which the USB memory device is seated; a connector shell within which the carrier is seated; and a lid connected to the connector shell.

In a further embodiment, the present technology relates to a USB memory assembly, comprising: a USB memory device; a carrier for receiving the USB memory device, the carrier including: a base portion and a cantilevered clip, opposite the base portion, for restraining the USB memory device in a first direction, first and second lips for restraining the USB memory device in a second direction parallel to the base portion and perpendicular to the first direction, and a latch formed on a surface of the cantilevered clip; a connector shell for receiving the carrier, the latch capable of affixing the carrier within the connector shell; and a lid connected to the connector shell.

In a further embodiment, the present technology relates to a method of fabricating a USB memory assembly, comprising: fabricating a USB memory device; inserting the USB memory device into a carrier; stocking a connector shell and lid at a location where the USB memory device is fabricated; inserting the carrier into the connector shell after insertion of the USB memory device into the carrier in said step (b).

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A USB memory assembly, including:
    a USB memory device;
    a carrier within which the USB memory device is seated;
    a connector shell within which the carrier is seated, the connector shell including an end portion with a size and shape that fits within a USB port of a host device; and
    a lid connected to the connector shell,
    wherein the connector shell is pivotally mounted within the lid by a pin fitting within a hole in the connector shell, and wherein the carrier includes a slot for aligning with the hole in the connector shell, the slot allowing insertion of the carrier within the connector shell without interference from the pin.

2. A USB memory assembly as recited in claim 1, wherein the carrier includes a base portion and a cantilevered clip for restraining the USB memory device in a first direction.

3. A USB memory assembly as recited in claim 2, wherein the carrier includes first and second lips for restraining the USB memory device in a second direction perpendicular to the first direction.

4. A USB memory assembly as recited in claim 2, wherein the carrier includes a first lip and a back wall for restraining the USB memory device in a second direction perpendicular to the first direction.

5. A USB memory assembly as recited in claim 1, wherein the carrier includes a latch for securely affixing the carrier within the connector shell.

6. A USB memory assembly as recited in claim 1, wherein the connector shell is fixedly mounted within the lid.

7. A USB memory assembly as recited in claim 1, wherein the carrier is formed of plastic.

8. A USB memory assembly as recited in claim 1, wherein the carrier is formed of a polycarbonate-acrylonitrile butadiene styrene polymer blend.

9. A USB memory assembly as recited in claim 1, further comprising an electrical connector between the connector shell and USB device for grounding the USB device.

10. A USB memory assembly, including:
    a USB memory device, the USB memory device including an end portion for being received within a USB port of a host device;
    a carrier for receiving the USB memory device, the carrier including:
    a base portion and a cantilevered clip, opposite the base portion, for restraining the USB memory device in a first direction, first and second lips for restraining the USB memory device in a second direction parallel to the base portion and perpendicular to the first direction;
    a connector shell for receiving the carrier;
    a latch formed on a surface of the cantilevered clip for affixing the carrier within the connector shell; and
    a lid connected to the connector shell, the end portion exposed externally of the lid,
    wherein the connector shell is pivotally mounted within the lid by a pin fitting within a hole in the connector shell, and wherein the carrier includes a slot for aligning with the hole in the connector shell, the slot allowing insertion of the carrier within the connector shell without interference from the pin.

11. A USB memory assembly as recited in claim 10, wherein USB memory device includes connector pins, and wherein the carrier is capable of receiving and holding the USB memory device with the connector pins exposed from within the carrier.

* * * * *